United States Patent [19]
Wheatley, Jr.

[11] 3,790,897
[45] Feb. 5, 1974

[54] DIFFERENTIAL AMPLIFIER AND BIAS CIRCUIT

[75] Inventor: Carl Franklin Wheatley, Jr., Somerset County, N.J.

[73] Assignee: RCA Corporation, New York, N.Y.

[22] Filed: Apr. 5, 1971

[21] Appl. No.: 130,974

[52] U.S. Cl. .................................. 330/30 D, 330/69
[51] Int. Cl. .................................. H03f 3/68
[58] Field of Search .......................... 330/30 D, 69 C

[56] References Cited

UNITED STATES PATENTS

| | | | |
|---|---|---|---|
| 3,684,971 | 8/1972 | Winkel | 330/30 D |
| 3,526,848 | 9/1970 | VanKessel | 330/30 D |
| 3,548,333 | 12/1970 | Bakk et al. | 330/30 D |
| 3,622,903 | 11/1971 | Stockler | 330/30 D |
| 3,626,825 | 12/1971 | Years | 330/126 X |

*Primary Examiner*—Nathan Kaufman
*Attorney, Agent, or Firm*—H. Christoffersen; Henry I. Schanzer

[57] ABSTRACT

Differential amplifier having reduced static and cross modulation errors. The amplifier includes first and second pairs of transistors, the emitters of each pair being connected to first and second current sources, respectively. A first additional transistor is connected at its emitter to the base of one transistor from each pair and at its base to the collector of one transistor from the first pair for forming a first input terminal. A second additional transistor is connected at its emitter to the base of the remaining transistors from each pair and at its base to the collector of the other transistor from the first pair for forming a second input terminal. A current signal is applied across the input terminals for controlling the subdivision of the current from the first current source between the two transistors of the first pair thereby controlling the subdivision of the current from the second current source between the two transistors of the second pair.

10 Claims, 3 Drawing Figures

INVENTOR.
CARL F. WHEATLEY
BY
Henry Schanzer
ATTORNEY

INVENTOR.
CARL F. WHEATLEY
BY Henry Schanzer
ATTORNEY

DIFFERENTIAL AMPLIFIER AND BIAS CIRCUIT

BACKGROUND OF THE INVENTION

The prior art circuit is described in detail in two articles by Barrie Gilbert in the IEEE Journal of Solid-State Circuits, Vol. SC-3, No. 4, Dec. 1968, at pages 353–373.

The prior art circuit shown in FIG. 1 is an example of a circuit having many desirable features but which in high precision application, such as multipliers, does not have the desired degree of accuracy. The circuit includes a differential amplifier stage comprising transistors Q1 and Q2 connected at their emitters to a current source $I_x$. A second pair of transistors (Q3 and Q4) is connected at their emitters to a constant current source $I_A$. Transistor Q3 is connected at its base and collector to the base of transistor Q1. The source of input current $I_{IN}$ is also connected to this common connection. Transistor Q4 is connected at its base and collector to the base of transistor Q2. The latter is connected to ground.

In the operation of the circuit of FIG. 1, when, $I_{IN}$ is a value such that, the current through transistor Q3 equals that through transistor Q4, their base-to-emitter drops ($V_{BE}$) are equal (assuming the transistors to be matched) and the potential difference across the base of transistors Q1, Q2 is zero volts. An increase in the input current, causing the current through transistor Q3 to exceed the current through transistor Q4, causes the $V_{BE}$ of transistor Q3 to increase and that of transistor Q4 to decrease. This differential voltage appears across the bases of transistors Q1 and Q2 causing transistor Q1 to conduct more current and transistor Q2 to conduct less.

An analysis of the circuit shows that the input current $I_{IN}$ is equal to the sum of the base current ($I_{b1}$) of transistor Q1 plus the collector current ($I_{c3}$) and the base current ($I_{b3}$) of transistor $Q_3$. [$I_{IN} = I_{b1} + I_{c3} + I_{b3}$].

The collector current of one transistor of a pair of transistors having their emitters connected to a common current source of amplitude $I_o$ may be expressed as $I_c = \alpha I_o f(V_b)$ where: $\alpha$ is that portion of the emitter current which reaches the collector and is also equal to $\beta/(\beta+1)$ where $\beta$ is the common emitter forward current gain; and $f(V_b) = [1/1 + e\,(V_{B2} - V_{B1}/h)]$ where: $V_{B1}$ and $V_{B2}$ are the potentials at the bases of transistors Q1 and Q2 and $h = KT/q$ where: K is Boltzman's constant, T is the temperature in degrees Kelvin and $q$ is the charge on an electron. Thus, the collector current ($I_{cl}$) of transistor Q1 may be expressed in terms of the current source $I_x$ as: $I_{cl} = \alpha_1 I_x f(V_b)$. Similarly, the collector current of transistor Q3 may be expressed in terms of constant current source $I_A$ as $I_{c3} = \alpha_3 I_A f(V_b)$ and the base current of transistor Q3 as $I_{b3} = (\alpha_3/\beta_3) I_A f(V_b)$.

Expressing $I_{IN}$ in terms of $I_A$ and $I_x$ produces:

$I_{IN} = [\alpha_3 I_A + (\alpha_3/\beta_3) I_A + (\alpha_1/\beta_1) I_x] f(V_b)$ Comparing $I_{c1}$ which is $I_{OUT}$ to $I_{IN}$ produces:

$$I_{OUT}/I_{IN} = [\alpha_1 I_x/\alpha_3 I_A + (\alpha_3/\beta_3) I_A + (\alpha_1/\beta_1) I_x] \quad (1)$$

Equation 1 may be rewritten as follows:

$$\frac{I_{OUT}}{I_{IN}} = \frac{1}{\frac{\alpha_3}{\alpha_1}\frac{I_A}{I_x} + \frac{\alpha_3}{\beta_3\alpha_1}\frac{I_A}{I_x} + \frac{1}{\beta_1}} \quad (2)$$

Equation 2 may be further simplified to produce:

$$\frac{I_{OUT}}{I_{IN}} = \frac{1}{\frac{I_A}{I_x}\left[1 + \frac{1}{\beta_1} + \frac{1}{\beta_1}\frac{I_x}{I_A}\right]} \quad (3)$$

Ideally, $I_{OUT}$ should equal $I_{IN} \times 1/(I_A/I_x)$. That is, $I_{OUT}$ should be independent of the transistor parameters and should equal $I_{IN}$ multiplied by the selected ratio of the current level $I_x$ to the current level $I_A$. Therefore, the terms other than unity present in the denominator of equation 3 are error producing. The error term relative to unity present in equation 3 is:

$$(1/\beta_1) + (1/\beta_1)(I_x/I_A).$$

An examination of the error term indicates that there exists a static error ($1/\beta_1$) and a cross modulation error ($1/\beta_1 \cdot I_x/I_A$) dependent on the ratio of $I_x$ to $I_A$. The static error is due to the base current drawn by the differential amplifier transistors (Q1, Q2). The full input current does not flow into transistor Q3 and that portion that flows into Q1 (due to the finite Beta of the latter) results in an error.

The cross modulation error is also due to the finite Beta ($\beta$) of the transistors and represents in art that portion of the emitter current which does not result in a collector current. For example, transistors Q3 and Q4 in response to an input signal change produce a change in the base voltages across the differential amplifier which is in error relative to the desired change in base voltages.

In addition to the above, FIG. 10, at page 371, of the cited article shows emitter followers driving the prior art circuit. These emitter followers do not minimize the errors discussed above. If a voltage source is applied to the emitter followers, they operate to convert the applied signal voltage into a emitter current which produces the $I_{IN}$ shown in FIG. 1. If the input signal to the emitter followers is a current source, the resulting current out of the transistors in Beta ($\beta$) dependent and the output current is, therefore, also Beta dependent. Therefore, with an input signal current into an emitter follower the configuration lacks Beta immunity and in fact is directly dependent on the Beta of the additional transistor.

A purpose of this invention is to provide a circuit such as discussed above but with improved performance and without undue increase in complexity or cost.

SUMMARY OF THE INVENTION

First and second current paths connected to a first current source for carrying the source current, each path having a control means for controlling the division of the current between the paths. Third and fourth current paths connected to a second current source, each one of said paths comprising first and second transistors. The first transistor is connected at its base to the emitter of the second transistor, at its emitter to the second current source and at its collector to the base of the second transistor for forming an input terminal.

The base of the first transistor of the third current path is connected to the control electrode for the first path and the base of the first transistor of the fourth path is connected to the control electrode of the second path. A signal may be applied across the input terminals for controlling the subdivision of current between the third and fourth current paths thereby controlling the subdivision of current between the first and second current paths.

BRIEF DESCRIPTION OF THE DRAWINGS

In the accompanying drawings like reference characters denote like components.

DETAILED DESCRIPTION OF THE INVENTION

Figures 1, 2:
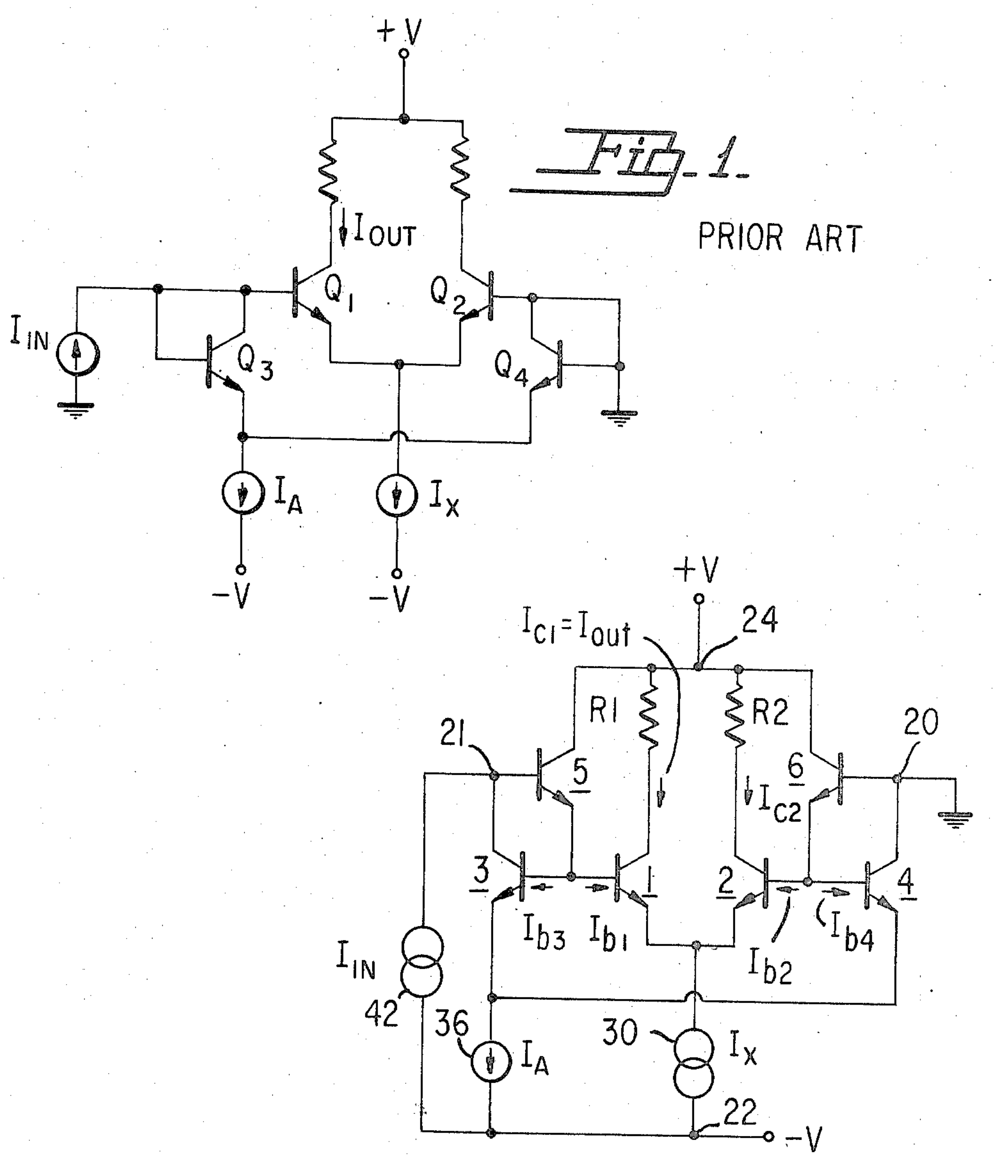
FIG. 1 PRIOR ART, FIG. 2
FIG. 1 is a drawing of a prior art circuit.
FIG. 2 is a schematic drawing of an amplifier stage embodying the invention.

FIG. 2 shows a differential amplifier stage comprising transistors 1 and 2. Their emitters are connected in common to one terminal of current source 30, the other terminal 22 of which is at a voltage −V volts. The collectors of transistors 1 and 2 are returned through impedances $R_1$ and $R_2$, respectively, to terminal 24 which is at a potential of +V volts. Transistors 3 and 4 have their emitters connected in common to one terminal of current source 36, the other terminal of which is connected to terminal 22. The base of transistor 5 is connected to the collector of transistor 3 at input terminal 21 and the emitter of transistor 5 is connected to the bases of transistors 1 and 3. The base of transistor 6 is connected to the collector of transistor 4 at ground terminal 20. The emitter of transistor 6 is connected to the bases of transistors 2 and 4. The collectors of transistors 5 and 6 are returned to terminal 24.

Current source 42, which is the source of the input signal current $I_{IN}$, is coupled between terminals 22 and 21.

In the circuit of FIG. 2, the sum of the currents flowing through the emitters of transistors 1 and 2 is equal to $I_x$ which is the current supplied by current source 30 and the sum of the currents flowing through the emitters of transistors 3 and 4 is equal to $I_A$ which is the current supplied by constant current source 36. Assuming the current flowing through transistors 3 and 4 to be equal and that the transistors are matched, the $V_{BE}$ of transistor 3 is equal to that of transistor 4. As a result, the base voltage of transistors 1 and 3 is equal to that of transistors 2 and 4 and, assuming transistors 1 and 2 to be matched, the currents through transistors 1 and 2 are equal to each other and to one-half $I_x$.

The signal current $I_{IN}$ is equal to the collector current ($I_{c3}$) of transistor 3 plus the base current ($I_{b5}$) of transistor 5. The base current $I_{b5}$ results in an emitter current ($I_{E5}$) some of which flows into the base of transistor 1 and some into the base of transistor 3 ($I_{E5} = I_{b3} + I_{b1}$). $I_{b3}$ plus $I_{c3}$ add to produce an emitter current ($I_{E3}$). If $I_{E3}$ is greater than one-half $I_A$, ($I_A/2$), then the emitter current supplied by transistor 4 is less than one-half $I_A$ by the amount $I_{E3}$ exceeds ($I_A/2$. That is, the sum of these two currents is always equal to $I_A$.

The base-to-emitter voltage ($V_{BE}$) of a transistor is a function of the current flowing through the transistor. If $I_{E3}$ is greater than $I_{E4}$, the base-to-emitter drop ($V_{BE3}$) of transistor 3 is greater than the base-to-emitter drop ($V_{BE4}$) of transistor 4. Vice-versa, when $I_{E3}$ is less than $I_{E4}$, $V_{BE3}$ is less than $V_{BE4}$.

The currents through transistors 3 and 4 determine the differential voltage applied across the bases of transistors 1 and 2 and thereby control the currents therethrough.

It is clear from the FIG. 2 circuit that the base current into transistors 5 or 6 is a much smaller portion of the input currents than in the prior art circuit. Also, perturbation of the input circuitry due to variations in $I_x$ are decreased by the product of the current gain of transistors 1 and 5.

The exact advantages of the circuit embodying the invention are best understood by a quantitative analysis and by deriving an expression of $I_{c1}$ ($I_{OUT}$) in terms of $I_{IN}$ and comparing the results to those obtained for the prior art circuit.

The collector current $I_{c1}$ of transistor 1 of the differential amplifier may be expressed in terms of the common emitter current source $I_x$ (as described above) as:

$$I_{c1} = \alpha_1 \cdot I_x \cdot f(V_b) \tag{4}$$

The base current ($I_{b1}$) is equal to the collector current divided by Beta:

$$I_{b1} = I_{c1}/\beta_1 \tag{5}$$

The collector current ($I_{c3}$) of transistor 3 may be expressed in terms of current source 36 of amplitude $I_A$ as follows:

$$I_{c3} = \alpha_3 \cdot I_A \cdot f(V_b) \tag{6}$$

The base current ($I_{b3}$) into transistor 3 may then be expressed as:

$$I_{b3} = (\alpha_3/\beta_3) \cdot I_A \cdot f(V_b) \tag{7}$$

The emitter current ($I_{E5}$) of transistor 5 is equal to $I_{b1} + I_{b3}$, and the base current $I_{b5}$ of transistor 5 is equal to the emitter current divided by ($\beta_5 + 1$) of the transistor. Thus, $$I_{b5} = (I_{b1} + I_{b3}/\beta_5 + 1) \tag{8}$$

The input current ($I_{IN}$) flowing into node 21 is equal to the collector current of transistor 3 ($I_{c3}$) and the base current of transistor 5 ($I_{b5}$).

$$I_{IN} = I_{c3} + I_{b5} \tag{9}$$

substituting equations 5, 6, 7, and 8 into equation 9 produces:

$$I_{IN} = \left[\alpha_3 I_A + \frac{\alpha_3}{\beta_3(\beta_5+1)} I_A + \frac{\alpha_1 I_x}{\beta_1(\beta_5+1)}\right] f(V_b) \tag{10}$$

Expressing $I_{c1} = I_{OUT}$ as a function of $I_{IN}$ produces:

$$\frac{I_{OUT}}{I_{IN}} = \frac{\alpha_1 I_x}{\alpha_3 I_A + \frac{\alpha_3}{\beta_3(\beta_5+1)} I_A + \frac{\alpha_1 I_x}{\beta_1(\beta_5+1)}} \tag{11}$$

Dividing the numerator and denominator of equation 11 by $\alpha_1$ $I_x$ produces:

$$\frac{I_{OUT}}{I_{IN}} = \frac{1}{\frac{\alpha_3}{\alpha_1}\frac{I_A}{I_x} + \frac{\alpha_3}{\alpha_1\beta_3(\beta_5+1)}\frac{I_A}{I_x} + \frac{1}{\beta_1(\beta_5+1)}} \tag{12}$$

Substituting for the first $\alpha_3/\alpha_1$ term in equation 12 the expression $(\alpha_3/\alpha_1) + (\alpha_3/\alpha_1\ \beta_3) - (\alpha_3/\alpha_1\ \beta_3)$ which reduces to $1 + (1/\beta_1) - (\alpha_3/\alpha_1\ \beta_3)$ results in the following:

$$\frac{I_{OUT}}{I_{IN}}=\frac{1}{\frac{I_A}{I_x}\left[1+\frac{1}{\beta_1}-\frac{\alpha_3}{\alpha_1\beta_3}+\frac{\alpha_3}{\alpha_1\beta_3(\beta_5+1)}+\frac{1}{\beta_1(\beta_5+1)}\frac{I_x}{I_A}\right]} \quad (13)$$

Combining the second and third terms in equation 13 produces:

$$\frac{I_{OUT}}{I_{IN}}=\frac{1}{\frac{I_A}{I_x}\left[1+\frac{\beta_3-\beta_1}{\beta_1(\beta_3+1)}+\frac{\alpha_3}{\alpha_1\beta_3(\beta_5+1)}+\frac{1}{\beta_1(\beta_5+1)}\frac{I_x}{I_A}\right]} \quad (14)$$

An examination of equation 14 shows that there is, as in the prior art, a static error and a cross modulation error. However, in contrast to the prior art circuit, these errors are considerably reduced. The static error is made up of two terms $[\beta_3 - \beta_1/\beta_1\ (\beta_3 + 1)]$ and $[\alpha_3/\alpha_1\ \beta_3\ (\beta_5 + 1)]$. The first term, $(\beta_3 - \beta_1)/\beta_1(\beta_3+1)$, indicates that the difference in the Betas of transistors 1 and 3 produces an error. In contrast to the prior art, the error is equal to the difference between two nearly equal terms $(\beta_3 - \beta_1)$ divided by slightly more than the product, $[\beta_1\ (\beta_3 + 1)]$, of the two terms. The second term, $[\alpha_3/\alpha_1\ \beta_3\ (\beta_5 + 1\ )]$ may be approximated by $[1/\beta_3\ (\beta_5 + 1)]$. The second term is normally much smaller than the first term and is, by a factor of $\beta$, smaller than the prior art circuit. This error term is due to that portion of $I_{IN}$ which flows into the base of transistor 5 and is "robbed" from flowing into the collector of transistor 3. The net value of the static error is thus considerably less than in the prior art circuit.

The cross modulation error which is equal to $[1/\beta_1\ (\beta_5 + 1)]\ (I_x/I_A)$ is $(\beta_5 + 1)$ times smaller than in the prior art. Thus, the most important error is considerably reduced. As is more fully explained below, where $I_x$ is a time varying signal which may also be an input signal, it is highly desirable that it's variation not be reflected in the input signal ($I_{IN}$) current path. Otherwise, the input signal (applied to input terminal 21) must supply the fractional portion of $I_x$ present at terminal 21, causing an error. The reduction in the cross modulation term clearly shows that the base currents into transistor 5 or 6 are less affected than prior art circuits by changes in the current source signals.

Figure 3:
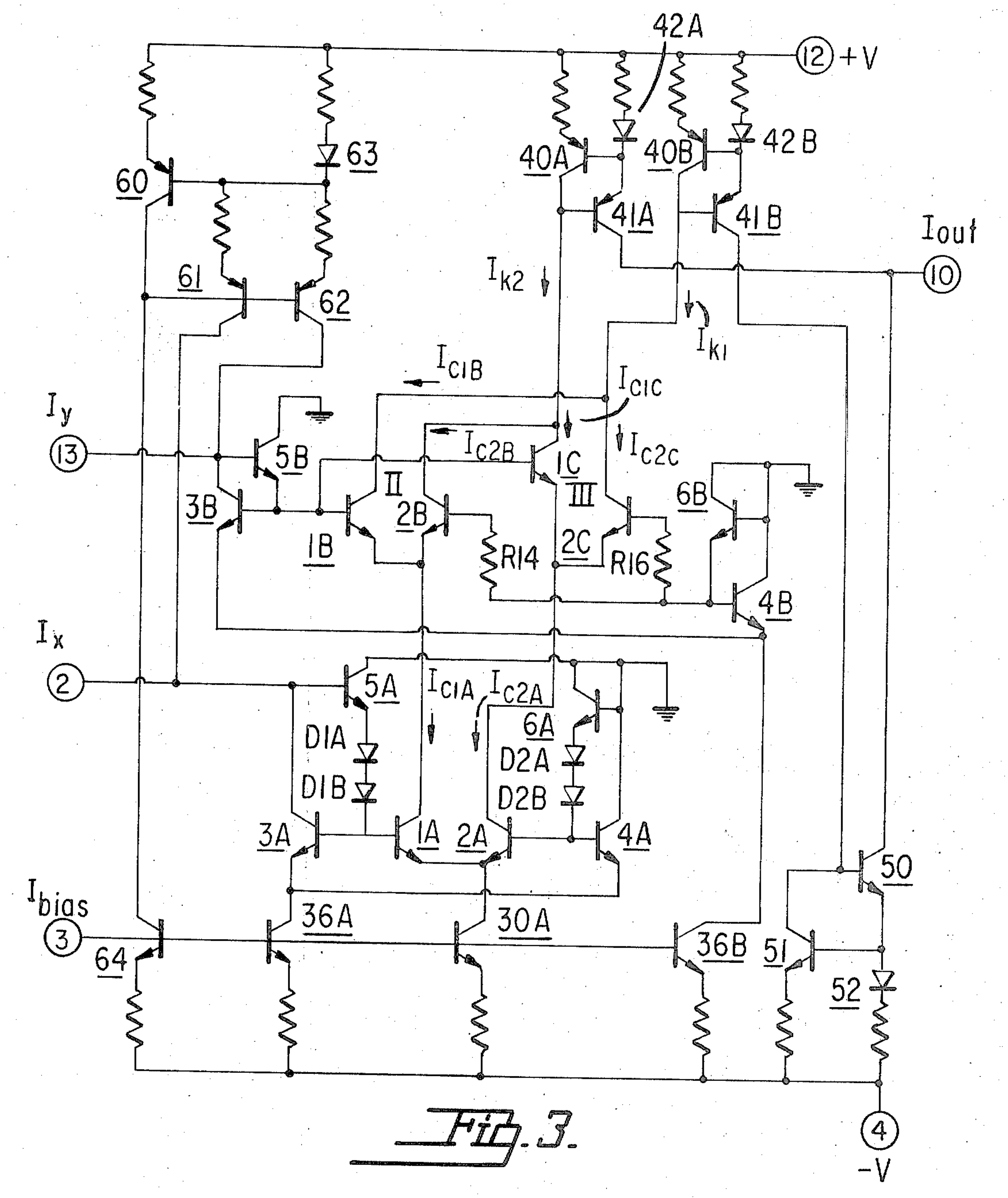
FIG. 3 is a schematic diagram of a multiplier circuit using amplifier stages embodying the invention.

FIG. 3 shows a multiplier using differential amplifier stages embodying the invention. It includes first amplifier I comprising transistors 1A and 2A differentially connected with their emitters connected in common to transistor 30A which is forward biased by a bias current, $I_{bias}$, applied at terminal 3 to provide a constant current into the emitters. The bases of transistors 3A and 4A are connected to the bases of transistors 1A and 2A, respectively. The emitters of transistors 3A and 4A are connected in common to the collector of transistor 36A which is biased to provide a constant current into the emitters. The collector of transistor 3A is connected to the base of transistor 5A and to input terminal 2 to which is applied an input current signal denoted by $I_z$. The collectors of transistors 4A and 5A and the collector and base of transistor 6A are connected to a point of reference potential which in this circuit is ground potential. The emitter of transistor 5A is connected by means of two level shifting forward biased diodes ($D_{1A}$, $D_{1B}$) to the bases of transistors 3A and 1A. The emitter of transistor 6A is similarly coupled by diodes $D_{2A}$, $D_{2B}$ to the bases of transistors 2A and 4A. The two diodes in each of the emitter legs provide sufficient voltage drop such that the differential amplifier transistors (1A, 2A) are not operated in the saturated region.

The operation of the circuit with the level shifting diodes is still similar to that of FIG. 2 but the potential at the base of transistors 1A, 3A and transistors 2A, 4A will be three base-to-emitter voltage drops ($3 \times V_{BE}$) below the potential at input terminals 2 and ground, respectively. This maintains transistors 1A and 2A out of saturation since their collector potential is kept at two $V_{BE}$ drops below ground potential.

The collector of transistor 1A is connected to a second differential stage, II, and the collector of transistor 2A is connected to a third amplifier stage, III, the amplifier stages being similar to the circuit of FIG. 2. Transistors 1B and 2B have their emitters connected in common to the collector of transistor 1A and the emitters of transistors 1C and 2C are connected in common to the collector of transistor 2A. The bases of transistors 1B and 1C are connected in common to the base of transistor 3B and to the emitter of transistor 5B. The base of transistor 5B is connected to the collector of transistor 3B at terminal 13 to which is applied a current signal denoted $I_y$. The bases of transistor 2B and 2C are connected by means of resistors $R_{14}$ and $R_{16}$, respectively, to the base of transistor 4B and to the emitter of transistor 6B. The collector of transistor 4B is connected to the collector and base of transistor 6B to which is applied ground potential. The emitters of transistors 3B and 4B are connected in common to the collector of transistor 36B which is forward biased to provide a constant current into the emitters.

The collector of transistors 2B and 1C are connected in common to the collector of PNP transistor 40 and to the base of PNP transistor 41 which form part of a first current mirror. The emitter and base of transistors 41A and 40A, respectively, are connected to the cathode of diode 42A. The emitter of transistor 40A and the anode of diode 42A are returned by current equalizing resistors to terminal 12 to which is applied +V volts. The collectors of transistors 1B and 2C are connected in common to the collector of transistor 40B and to the base of transistor 41B which form part of a second current mirror. The base of transistor 40B is connected in common with the emitter of transistor 41B to the cathode of diode 42B. The emitter of transistor 40B and the anode of diode 42B are connected by current limiting resistors to terminal 12. Note that the diodes shown in FIG. 3 are transistors whose bases are shorted to their collector.

The collector of transistor 41A is connected to the base of transistor 50 which forms part of a third current mirror. The collectors of transistors 41B and 50 are connected in common to output terminal 10 at which the product of the $I_z$ input signal and the $I_y$ input is available. Transistor 51 has its collector-base region connected across the base-to-emitter region of transistor 50. The emitter and base of transistor 50 and 51, respectively, are connected to the anode of diode connected transistor 52. The emitter of transistor 51 and the cathode of diode 52 as well as the emitters of transistors 30A, 36A, and 36B are returned by means of current determining resistors to terminal 4 to which is applied −V volts.

The quiescent currents for the multiplier are provided by means of current source transistor 64 and the current mirror comprising transistors 60, 61, 62, and 63. Transistor 64 is forward biased in the same manner as the other current sources (30A, 36A, 36B) and has its collector connected to the collector of transistor 60 and to the bases of transistors 61 and 62. The collectors of transistors 61 and 62 are returned to the bases of transistors 5A and 5B, respectively. The collector currents of transistors 61 and 62 establish the quiescent current level conditions when the input signals are zero. The emitters of transistors 61 and 62 are connected through current equalizing resistors to the base of transistor 60 and to the cathode of diode connected transistor 63. The emitter of transistor 60 and the anode of transistor 63 are returned by means of current determining resistors to terminal 12.

An examination of the operation of the circuit of FIG. 3 indicates the benefits of using circuits having greater accuracy.

Assume that transistor 30A produces a constant current $I_{30A}$ and that under balanced condition ($I_z = 0$) the current through transistor 1A equals the current through transistor 2A which equals $I_{30A}/2$. Assume now that $I_z$ increases causing an increase in the collector current of transistor 1A of a given amount and a decrease in the collector current of transistor 2A of the same amount. The change in the collector current is approximately equal (as described earlier) to $\Delta I_z$ multiplied by the ratio of $I_{30A}$ to $I_{36A}$ [$\Delta I_{c1A} \cong \Delta I_z \cdot (I_{30A}/I_{36A})$] (where $I_{36A}$ is the current supplied by constant current source 36A). As a result, the emitter current to amplifier II comprising transistors 1B and 2B is larger than the current to amplifier III comprising transistors 1C and 2C.

Assume now that a signal current $I_y$ supplied to terminal 13 is greater than zero. The current through transistors 1B and 1C increase while the currents through transistors 2B and 2C decrease. The collector current through transistor 1B is summed with the collector current through transistor 2C to form current $I_{K1}$ and similarly the collector current of transistor 2B is summed with the collector current of transistor 1C to form current $I_{K2}$. The summing of currents from the complementary sides of the differential amplifiers ensures that when $I_y$ or $I_z$ is zero that the output currents are equal---the differential between the two currents being zero, the output signal produced at output terminal 10 of the multiplier is also zero.

However, with $I_z$ greater than zero, the differential stage (IB, 2B) of amplifier II conducts more quiescent current than the differential stage (1C, 2C) of amplifier III while the bias current (through transistors 3B, 4B) is the same for both amplifiers II and III. As a result, the signal amplification of amplifier II will be greater than that of amplifier III. A net differential current is produced which by means of the first, second and third current mirrors produces an output at terminal 10 which is a product of $I_z$ and $I_y$.

Note that the $I_z$ signal is first processed by amplifier I and the output of amplifier I together with the $I_y$ signal is processed by amplifiers II and III. The outputs of amplifiers II and III are then summed and the D.C. or quiescent components are subtracted before a net output signal is produced at output 10.

Errors in the amplification of the signal thus get multiplied through the stages and, of course, when large numbers are substracted from each other the chance of error increases. It is, therefore, a considerable achievement to have stages in which the error level is decreased by an order of magnitude or more.

The amplifiers have been shown using NPN bipolar transistors. It should be evident that PNP transistors as well as other known type of transistors could be used instead.

In the figures, current source 36A and 36B have been assumed to be constant. It should be understood that these sources could also be varied along with transistor 64 to provide a continuously varying multiplier ratio or a digitally controlled multiplier ratio.

Also, the amplifiers shown in the figures are single-ended input stages with a current signal applied to one side and ground potential applied to the other side. It should be appreciated that the one side of the amplifier connected to ground potential could be returned to a voltage source whose potential is other than ground potential and which in fact may be time varying.

What is claimed is:

1. In combination:

first and second substantially constant current sources, each having two terminals;

first and second semiconductor devices, each device having a conduction path and a control electrode for controlling the conductivity of said conduction path; means connecting one end of each conduction path to one of the two terminals of said first current source for carrying its source current and means for coupling the other end of each conduction path to a first voltage terminal for receiving a potential, the other one of the two terminals of said first current source being connected to a second voltage terminal for receiving a potential;

first and second means, each means comprising first and second transistors, the base of the first transistor being connected to the emitter of the second transistor, the emitter of the first transistor being connected to one of said two terminals of said second current source, and the collector of the first transistor being connected to the base of the second transistor; the base of the first transistor of the first means being connected to the control electrode of said first semiconductor device and the base of the first transistor of the second means being connected to the control electrode of said second semiconductor device;

two input terminals adapted to receive input signals, one input terminal connected to the base of the second transistor of said first means and the other input terminal connected to the base of the second transistor of said second means; and means for coupling the collector electrodes of the second transistors of said first and second means to said first voltage terminal.

2. The combination as claimed in claim 1 wherein each one of said semiconductor device is a transistor having a collector, an emitter, and a base, and wherein the collector-to-emitter path of a transistor is said conduction path of said device and wherein saidbase is said control electrode and wherein the emitters of said semiconductor devices are connected to said one of the two terminals of said first current source.

3. The combination as claimed in claim 1 including means for supplying an input signal current to one of the input terminals and a reference potential to the other input terminal.

4. The combination comprising:

first and second current sources, each source having two terminals;

first, second, third, fourth, fifth, and sixth transistors, each having a base, an emitter, and a collector;

means connecting the emitters of said first and second transistors to one terminal of said first current source;

means connecting the emitters of said third and fourth transistors in common to one terminal of said second current source;

means direct current connecting the emitter of said fifth transistor to the bases of said first and third transistors, and means direct current connecting the emitter of said sixth transistor to the bases of said second and fourth transistors;

first and second terminals for the application of signals;

means direct current connecting the base of said fifth transistor and the collector of said third transistor to said first terminal, and means direct current connecting the collector of said fourth transistor and the base of said sixth transistor to said second terminal;

first and second output load means connected between the collectors of said first and second transistors, respectively, and a point of potential; and means for coupling the collectors of the fifth and sixth transistors to the other ones of said two terminals of said first and second current sources.

5. The combination as claimed in claim 4 wherein said first current source is a variable current source and wherein said second current source is a constant current source.

6. The combination as claimed in claim 4 wherein said current sources are variable current sources.

7. The combination as claimed in claim 4 wherein said transistors are bipolar transistors of the same conductivity type.

8. The combination as claimed in claim 5 wherein the signal applied to said first terminal is a current, wherein a reference potential is applied to the second input terminal and wherein the potential applied to the collectors of said fifth and sixth transistors is a fixed potential.

9. The combination as claimed in claim 5 wherein the means coupling the emitter of said fifth transistor to the bases of said first and third transistors includes at least one forward biased diode and wherein the means coupling the emitter of said sixth transistor to the bases of said second and fourth transistors include at least one forward biased diode.

10. The combination comprising:

first and second substantially constant current sources, each source having two terminals;

a first difference amplifier stage comprising first and second transistors having their emitters connected in common to one terminal of said first current source;

first and second input terminals for the application of signals thereto to be amplified by said difference amplifier stage;

a third transistor having its base connected to said first input terminal and its emitter to the base of said first transistor and a fourth transistor having its base connected to said second input terminal and its emitter to the base of said second transistor;

means for controlling the amplification of said difference amplifier stage comprising fifth and sixth transistors having their emitters connected in common to one terminal of said second constant current source with the base of said fifth transistor connected to the base of said first transistor and its collector to said first input terminal and with the base of said sixth transistor connected to the base of said second transistor and its collector to the second input terminal; and means for coupling the collectors of said first, second, third and fourth transistors to the other ones of said two terminals of said first and second current sources.

* * * * *